United States Patent
Heigl et al.

(10) Patent No.: US 8,159,242 B2
(45) Date of Patent: Apr. 17, 2012

(54) HANDLING DEVICE FOR POSITIONING A TEST HEAD AT A TEST STATION

(76) Inventors: Hubertus Heigl, Munich (DE); Helmuth Heigl, Kolbermoor (DE)

( * ) Notice: Subject to any disclaimer, the term of this patent is extended or adjusted under 35 U.S.C. 154(b) by 1075 days.

(21) Appl. No.: 12/043,358

(22) Filed: Mar. 6, 2008

(65) Prior Publication Data
US 2008/0219814 A1    Sep. 11, 2008

(30) Foreign Application Priority Data
Mar. 9, 2007  (DE) .......................... 10 2007 011 700

(51) Int. Cl.
*G01R 31/00* (2006.01)
*G01D 21/00* (2006.01)
(52) U.S. Cl. .................................. 324/750.16; 73/866.5
(58) Field of Classification Search .................. None
See application file for complete search history.

(56) References Cited

U.S. PATENT DOCUMENTS

| | | | |
|---|---|---|---|
| 3,804,367 A | 4/1974 | Johnson | |
| 4,478,307 A | 10/1984 | Natzke et al. | |
| 4,705,447 A * | 11/1987 | Smith | 414/590 |
| 4,799,398 A | 1/1989 | Asano | |
| 5,189,364 A * | 2/1993 | Kazama | 324/755.05 |
| 5,931,048 A * | 8/1999 | Slocum et al. | 74/490.07 |
| 6,940,273 B2 | 9/2005 | Heigl et al. | |
| 7,383,746 B2 * | 6/2008 | Heigl | 73/866.5 |
| 2005/0194985 A1 | 9/2005 | Heigl | |
| 2006/0156850 A1 * | 7/2006 | Mueller | 74/490.01 |
| 2006/0177298 A1 * | 8/2006 | Mueller | 414/791.2 |
| 2006/0272901 A1 | 12/2006 | Heigl | |

FOREIGN PATENT DOCUMENTS

| | | |
|---|---|---|
| DE | 1461601 U | 3/1939 |
| DE | 3407551 A1 | 9/1985 |
| DE | 101 32 489 | 4/2003 |
| DE | 10 2004 008 487 | 9/2005 |
| DE | 10 2005 019 564 | 11/2006 |
| WO | WO 03/089834 A2 | 10/2003 |

* cited by examiner

*Primary Examiner* — Vinh Nguyen
(74) *Attorney, Agent, or Firm* — Brian B. Shaw, Esq.; Michael J. Didas, Esq.; Harter Secrest & Emery LLP

(57) ABSTRACT

A handling device for positioning a test head, in particular at a test station, is provided with a positioning means enabling the test head to be positioned with respect to three dimensions. The handling device also has a mounting on which the test head can be attached and which is connected to the positioning means. The handling device is also provided with a fastening plate which is movably mounted and a compliance module by means of which the fastening plate can be moved between a starting position (I) and an end position (II, III) against the effect of a return force. The compliance module includes a housing, a spindle, a first sliding bushing and a second sliding bushing which are arranged in a movable manner on the spindle between a first stop and a second stop, and a spring element arranged between the sliding bushings and which impinges on the sliding bushings. The sliding bushings are movable relative to the housing. The compliance module permits bi-directional compliance of the test head.

22 Claims, 6 Drawing Sheets

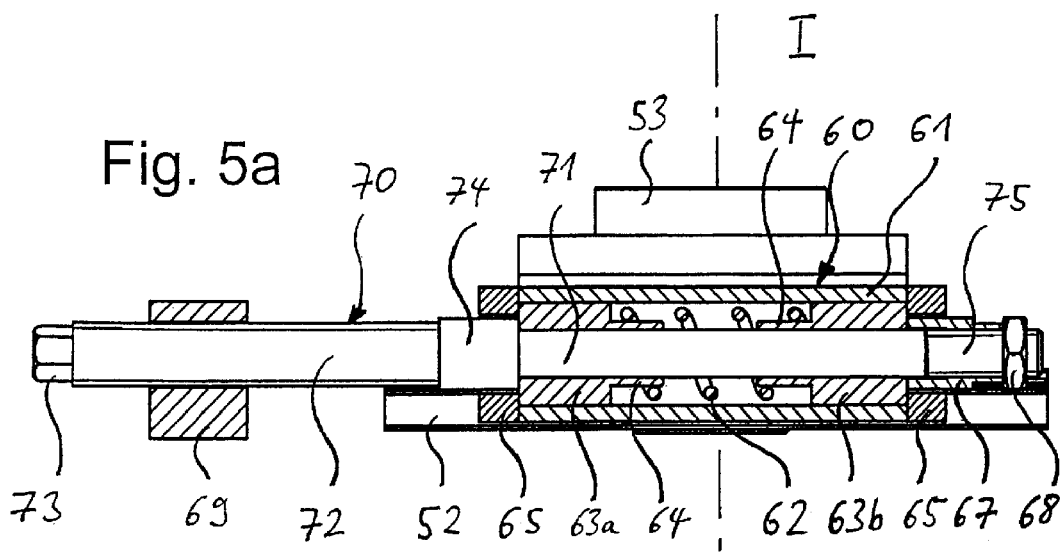
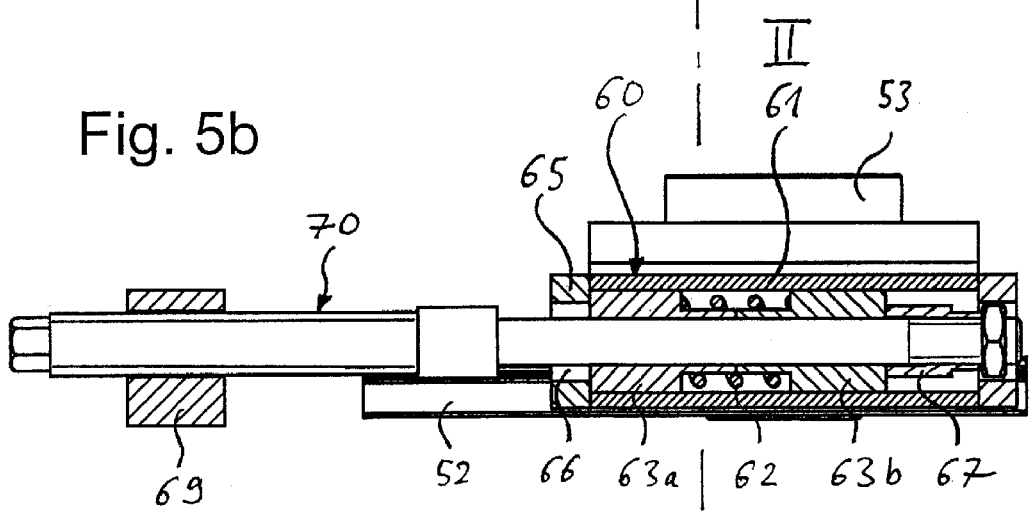
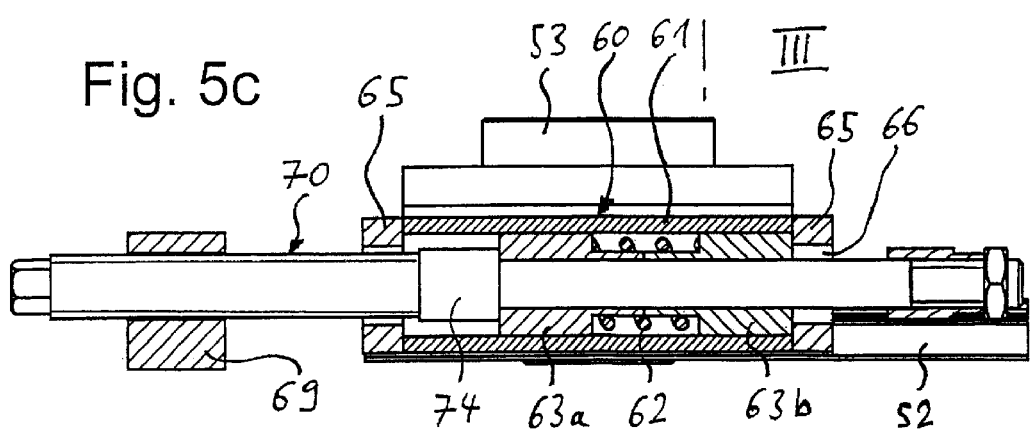

they are arranged in the housing in a simple way. In the movement from the starting position to the end position the housing cap serves as a catch to ensure that the sliding bush-

HANDLING DEVICE FOR POSITIONING A TEST HEAD AT A TEST STATION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

1. Field of the Invention

The invention relates to a handling device which serves to position a test head at a test station and which is provided with a positioning means enabling the test head to be positioned with respect to three dimensions. The handling device is also provided with a mounting to which the test head can be attached and which is connected to the positioning means. The invention also relates to a compliance module which is particularly applicable for such a handling device.

A handling device or manipulator for positioning a measuring head usually has several degrees of freedom in terms of translation and rotation which enable the test head to be spatially positioned with precision. Such a handling device is thus used as a rule for the testing of electronic components such as integrated circuits (ICs) or wafers. In order to be able to test the quality of electronic components it is necessary to move the relatively heavy test head into a precise position close to the test station. The test station, which may be known as a handler, for example, holds the electronic components to be tested by the test head. To achieve an accurate measurement result when testing electronic components, it is essential for the test head to dock with the test station exactly. For this reason, it is indispensable for the handling device which positions the test head to be smooth-running and precisely adjusted.

2. Description of Related Art

A handling device which positions a test head is described in DE 101 32 489 B4. The handling device has a positioning means for spatially positioning the test head which is provided with articulated arms that move in a horizontal plane.

In addition to the precision that is required for reproducible adjustment, it has also proved expedient to correct the position of the test head with a slight to-and-fro movement after it has docked with the test station. Such correction of the position of the test head, which facilitates docking, requires the positioning means or the mounting to be able to yield slightly. A handling device which is able to yield is described in DE 10 2004 008 487 B4.

SUMMARY OF THE INVENTION

The present handling device includes a compliance module having a housing which has, arranged inside it, an inner bushing that is movable in an axial direction and impinges on the spring element. The compliance module also has a bolt with a threaded section which engages with threads on the inside of the inner bushing. The bolt has a head which positions the inner bushing within the housing against the pressure of the spring element and which forms an end stop in the axial direction. The inner bushing has a free end bordering on the fastening plate. If the fastening plate is moved from an initial position into an end position the inner bushing is pushed in an axial direction against the pressure of the spring element, thus inducing the return force which ensures that the fastening plate automatically returns from the end position into the initial position.

The compliance modules of known handling devices operate in one direction. To achieve bi-directional compliance it is thus necessary to have two compliance modules operating in contrary directions acting on the fastening plate.

The object of the invention is to provide a handling device which is able to accomplish bi-directional compliance in a simple way.

The handling device according to the invention is based on the notion of achieving bi-directional compliance through one individual compliance module coupled to a fastening plate and with a housing, a spindle, two sliding bushings and a spring element. The housing is attached to the fastening plate which can be arranged on the positioning means or on the mounting. The sliding bushings which are arranged on a spindle extending in an axial direction within the housing and are movable between two stops along this spindle. The spring element is positioned between the sliding bushings, which are movable in relation to the housing and impinge on them in the axial direction. The compliance module enables the fastening plate to be moved, against the effect of a return force generated by the spring element, between not only one starting position and a first end position but also the starting position and a second end position, and thus to provide bi-directional compliance.

This is attributable to the fact that in the starting position the sliding bushings are pressed against the stops by the spring elements which for this purpose are best configured as pressure springs. If the fastening plate is moved from the starting position into one of the end positions then the housing attached to the fastening plate will be pushed over the forward-positioned—in the direction of travel—sliding bushing and, at the same time, the sliding bushing at the rear will be moved in the direction of the forward-positioned one. As this happens, the spring element between the sliding bushings is compressed. Once the force that moves the fastening plate into the end position, e.g. a manually generated force, is removed, the rear sliding bushing and the housing as well as the fastening plate attached to this housing automatically return to the starting position as a result of the return force induced by the compression of the spring element. If the fastening plate is moved into the other end position, then the housing is pushed over what has previously been described as the rear sliding bushing and is now the forward bushing in the direction of travel and at the same time the previously forward and now rear sliding bushing is moved towards the now forward bushing. As a result of the movement of the rear sliding bushing in the direction of the forward sliding bushing, which is now up against the stop and thus stationary, the spring element between the bushing is compressed and thus generates the return force by means of which the fastening plate is restored automatically into the starting position.

It is preferable for the housing to be closed by at least one cap. It is expedient for the housing cap, which is preferably mounted detachably on the front face of the housing, to be provided with an aperture through which the spindle extends. The detachable mounting of the cap enables the sliding bushings to be arranged in the housing in a simple way. In the movement from the starting position to the end position the housing cap serves as a catch to ensure that the sliding bushing at the rear in the direction of movement is moved together with the housing. Depending on the application, the catch function can also be performed by a recess in the housing.

It is also advantageous if at least one of the sliding bushings, preferably both, is provided with a step against which the spring element can be braced. The step ensures reliable tension of the spring element between the sliding bushings. Furthermore, the flange can form a stop against which, in the end position, the two sliding bushings bump to prevent the spring element from being compressed too much.

It is preferable for both, or at least one, sliding bushing to be provided with a sliding surface which is in contact with the housing. The sliding surface ensures a low level of friction in the relative movement between the bushing and the housing. In this context it has also proved expedient for the spindle to be provided with a sliding section on which the sliding bushings are arranged.

It is advantageous for the spindle to be provided with a collar which forms the first stop. It is expedient for the diameter of the collar to be smaller than the diameter of the aperture in the cap of the housing. This ensures that, in the movement between the starting position and the end position, the housing can be moved beyond the stop.

In a preferred embodiment of the handling device according to the invention the spindle is provided with a threaded section on which an adjustment nut is located. This adjustment nut, which preferably forms the second stop and is held in position by a locking nut, makes it possible to set the distance between the first stop and the second stop. It is practical for the distance between the two stops to be set so that in the starting position the surface of the adjustment nut facing the sliding bushing aligns with the inner surface of the housing cap so that, in the starting position, the surface of the sliding bushing that faces away from the spring element abuts against both the inner surface of the housing cap and the adjustment nut. In this way any axial play between the housing and the spindle is avoided and the compliance module will accordingly function with precision. For practical reasons the diameter of the adjustment nut as well as of the locking nut should be smaller than the diameter of the aperture in the housing cap to ensure that, in its movement from the starting position to the end position, the housing can be moved beyond the adjustment nut and the locking nut.

A particularly suitable embodiment is achieved when the spring element between the sliding bushings is pre-tensioned. Such pre-tensioning of the spring element has the advantage that the movement from the starting position into the end position is only possible when a force stronger than the pre-tensioning force acts on the fastening plate.

It is also advantageous to provide the spindle with a second threaded section which engages a spindlenut. This threaded section, which expediently should be located on the side of the spindle stop distant from the sliding section, enables the spindle to move relative to the spindlenut and accordingly the position of the compliance module to be adjusted. To achieve the turning of the spindle required for a movement of the spindle relative to the spindlenut, the spindle is provided with an actuating section which may be configured in a hexagonal shape, for example, that enables the spindle to be turned by means of a spanner.

It is preferable for the fastening plate to be arranged so that it is movable in a linear plane. In this way the position of the test head mounted of the fastening plate can be corrected with a linear to-and-fro movement. Alternatively, the fastening plate can be mounted so that it can swivel around an axis of rotation.

It is an advantage if the fastening plate and the housing are connected rigidly with each other so that the movement of the fastening plate is transferred to the compliance module. In this context it has proved beneficial for the fastening plate and the housing to be designed as one piece to achieve this rigidity in the simplest way. Depending on the application in question, the fastening plate and the housing can also be attached to each other in an articulated fashion. Such a configuration lends itself particularly well to the situation in which the fastening plate can be swivelled around an axis of rotation. In such situations it has proved expedient to provide the housing or the spindle with an eyelet which facilitates an articulated connection. In order, when necessary, to hold the fastening plate in a fixed position, it is useful to have a locking device which can hold the fastening plate in a prescribed position.

In a preferred embodiment of the handling device according to the invention, the mounting has two lateral arms between which the test head can be held. These lateral arms ensure that the test head is held securely, even when the head is relatively heavy. It is preferable if the fastening plate is arranged on at least one of the lateral arms so that the test head can be secured onto the fastening plate and thus can benefit from the bi-directional adjustment provided by the compliance module.

Details and further advantages of the handling device according to the invention will become clear from the following description of examples of preferred embodiments. The figures, which give merely schematic representations of examples of embodiments, show the recited views in detail.

FIG. 5a is a cross-section along the line V-V in FIG. 3 showing the compliance module in a starting position;

FIG. 5b is a cross-section as in FIG. 5a showing the compliance module in a first end position;

FIG. 5c is a cross-section as in FIG. 5a showing the compliance module in a second end position;

DETAILED DESCRIPTION OF THE INVENTION

Figure 1:
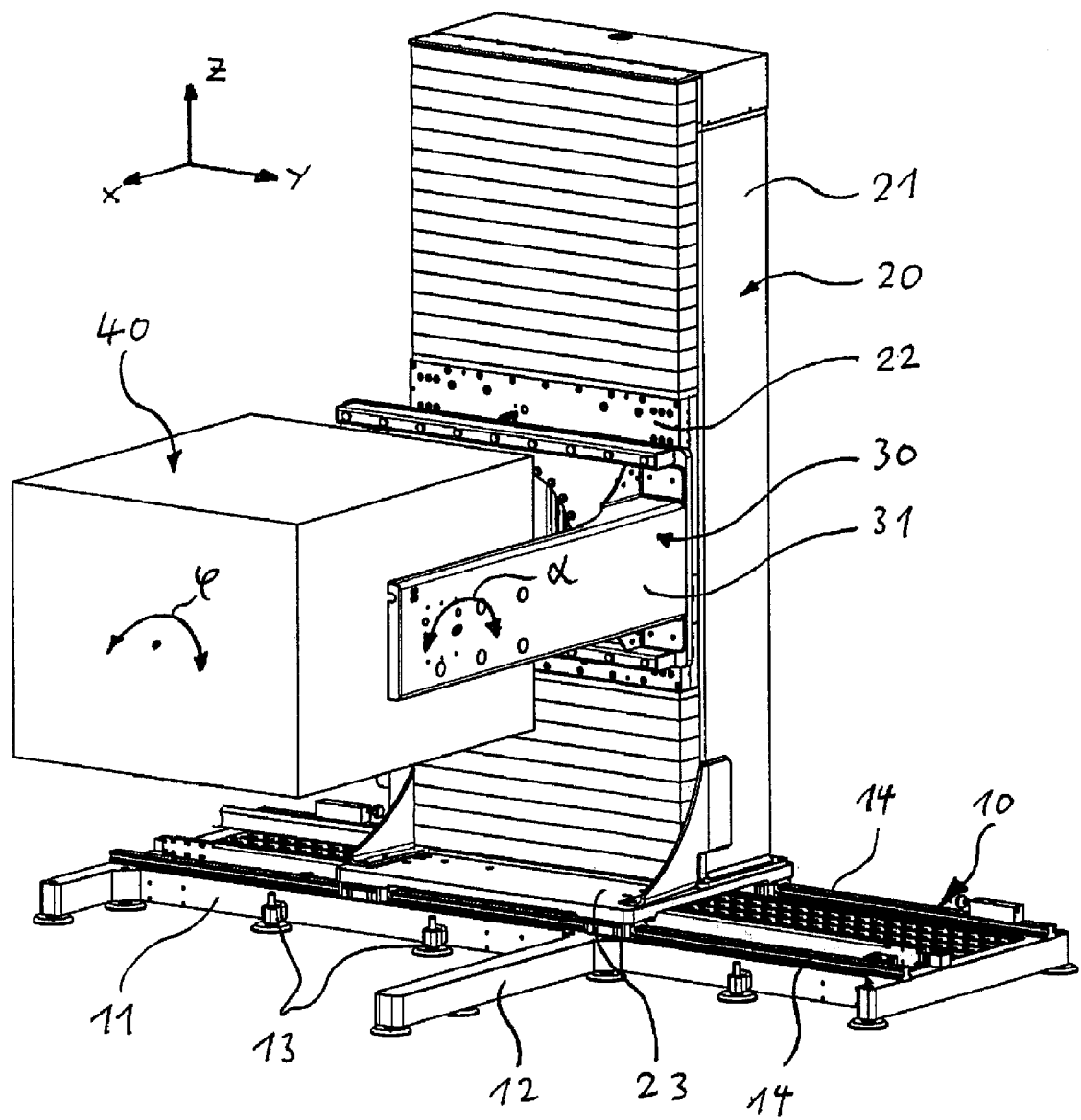
FIG. 1 is a perspective view of a handling device which has a mounting on which a test head is positioned.

The handling device shown in FIG. 1 serves to position a test head 40 next to a test station (not shown) for electronic components such as integrated circuits or wafers. For this purpose the handling device has a positioning means 20 supported on a sub-frame 10 and connected to a mounting 30. The positioning means 20 comprises a tower 21 extending in the vertical direction z and on which a vertical carriage 22 is arranged. The vertical carriage 22 can be moved in a linear fashion in the vertical direction z and can be driven by some form of motor for this purpose. The tower 21 is located on a horizontal carriage 23 which can move in a linear fashion in a horizontal direction y along the sub-frame 10. Depending on the application, a swivel plate can be arranged on the horizontal carriage 23 so that the tower 21 can swivel around an axis of rotation extending in the vertical direction z as is known from DE 101 32 489 B4.

The sub-frame 10 has two beams 11 extending in the horizontal direction y supported by two crossbeams 12 extending in a horizontal direction x orthogonal to the beams 11. To ensure adequate stability of the handling device even when the ground is uneven, the beams 11 and the crossbeams 12 are mounted on adjustable foot plates 13. The beams 11 carry the guide rails 14 along which the horizontal carriage 23 can run in the horizontal direction y.

Figure 2:
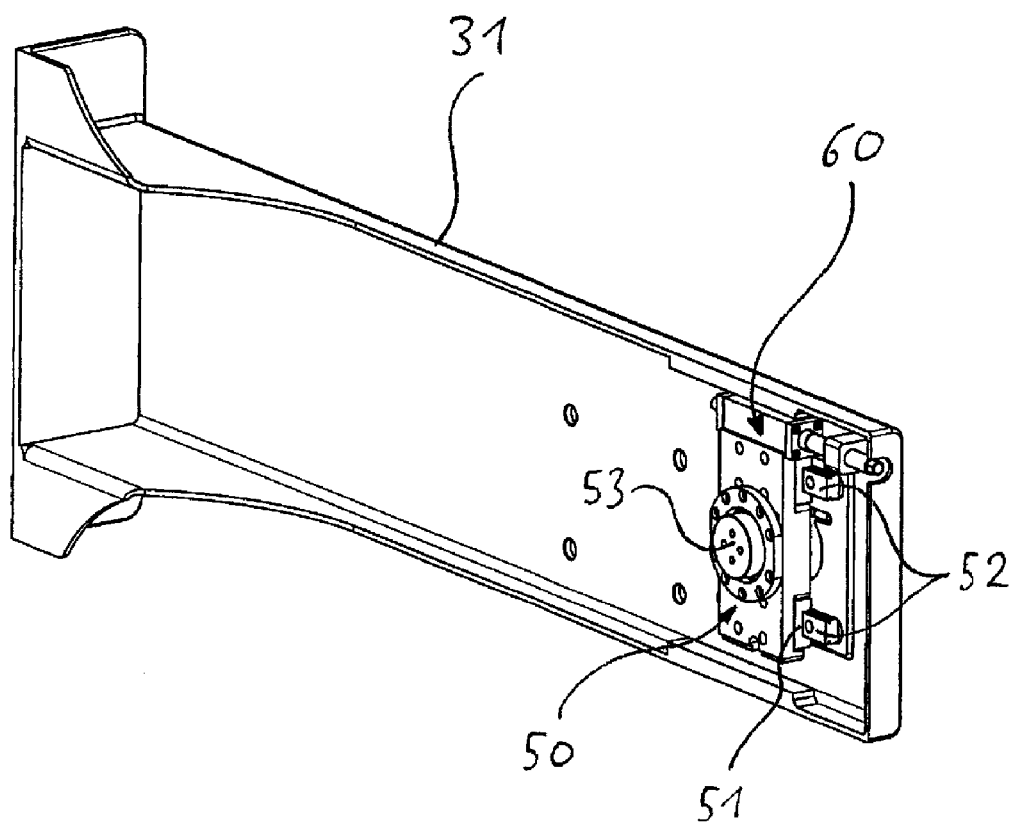
FIG. 2 is a perspective view of a lateral arm of the mounting on which a fastening plate connected to a compliance module is mounted.

The mounting 30 is connected to the vertical carriage 22. Depending on the application, the mounting 30 can be arranged in a rotatable manner on the vertical carriage 22 to enable the test head 40 to perform what is known as the twist movement φ. The mounting has two lateral arms 31 between which the test head is held. For this purpose, each of the lateral arms 31 has a fastening plate 50 which can be moved in a linear fashion by means of carriages 51 and guide rails 52, as can be seen in particularly in FIG. 2. The fastening plate 50 is also provided with a rotary guide 53 which enables the test head 40 to perform what is known as a tumble movement α.

Figure 3:
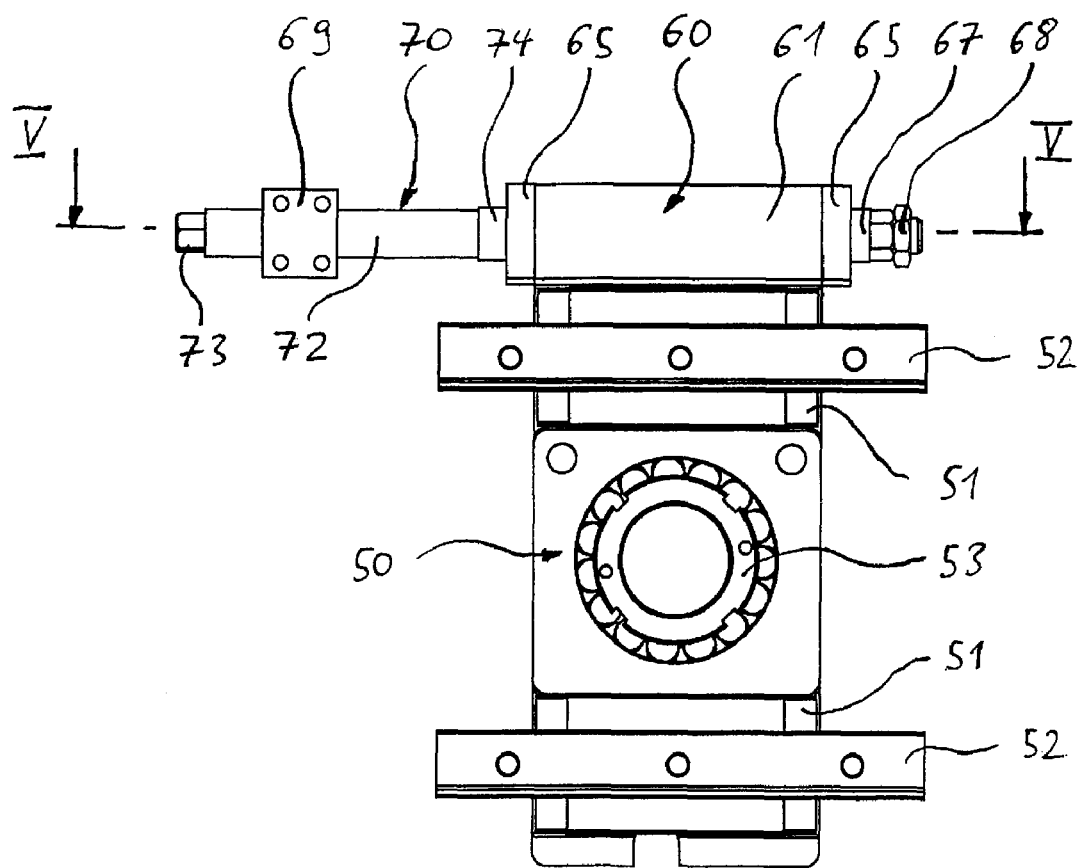
FIG. 3 is a side view of the fastening plate and the compliance module.
Figure 4:
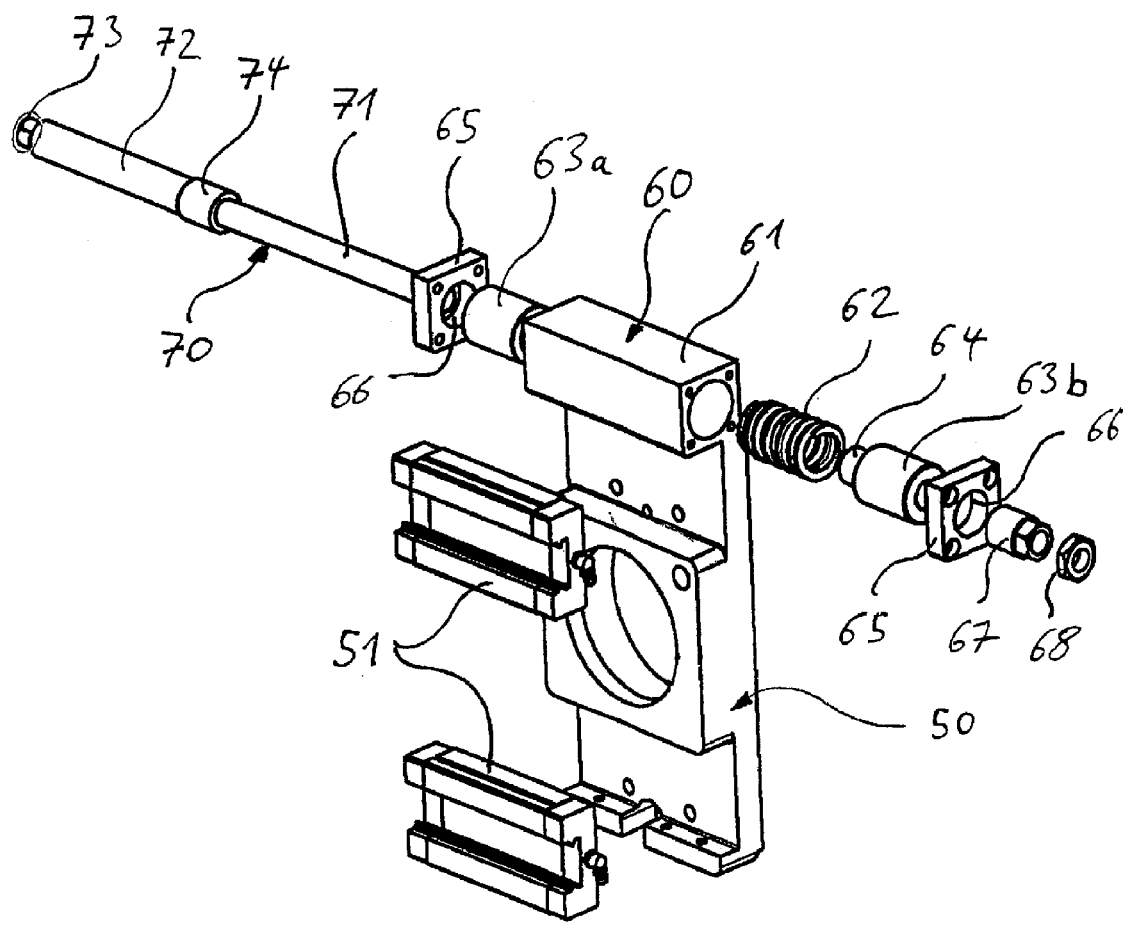
FIG. 4 is an exploded view of the fastening plate and the compliance module.

As can be seen in particular in FIGS. 3 and 4, the fastening plate 50 is linked to a compliance module 60. In the present case, the link is achieved by a rigid connection between the fastening plate 50 and the compliance module 60. The rigid connection results from the one-piece design of the fastening plate 50 and a housing 61 of the compliance module 60. Depending on the application, the fastening plate 50 and the compliance module 60 can also be linked to each other in an articulated manner.

In addition to the housing 61, the compliance module 60 comprises a spindle 70 which extends in an axial direction in the housing 61. The spindle 70 is provided with a sliding section 71 on which the two sliding bushings 63a, 63b are movably mounted. The movement of the sliding bushings 63a, 63b in the axial direction is limited by two stops. The first stop is formed by a collar 74 on the spindle 70. The second stop is formed by an adjustment nut 67 which is positioned movably on the threaded section 75 of the spindle 70 as can be seen particularly in FIG. 5a. The threaded section 75 abuts against the end of the sliding section 71 that is farthest away from the collar 74. On the threaded section 75 there is also a locking nut 68 by means of which the adjustment nut 67, and thus also the second stop, can be anchored in a prescribed fixed position.

Between the sliding bushings 63a, 63b there is a spring element 62 configured as a pressure spring, which impinges on the sliding bushings in the axial direction. The sliding bushings 63a, 63b are each provided with a step or flange 64 on which the spring element 62 is braced. The spring element 62 is pre-tensioned. The tension is provided on the one hand by the resilience of the spring element 62, and on the other hand by the distance between the collar 74 and the adjustment nut 67 and can be varied as required by a change in the position of the adjustment nut 67 on the threaded section 75.

The sliding bushings 63a, 63b are movable relative to the housing 61. To ensure low-frictional movement of the sliding bushings 63a, 63b relative to the housing 61, the surface of the sliding bushings 63a, 63b that is supported on the housing 61 can be configured as a sliding surface. The movement of the sliding bushings 63a, 63b on the sliding section 71 takes place within the housing 61. For this purpose the housing 61 is closed on each of its end faces by a housing cap 65 which is detachably mounted, for example with screws, on the housing 61. It is expedient for the adjustment nut 67 to be so positioned on the threaded section 75 that in the starting position I of the compliance module 60 the surface of the adjusting nut 67 facing the sliding bushing 63b is flush with the inner surface of the housing cap 65 corresponding to the sliding bushing 63b. The housing caps 65 each have an aperture 66 through which the spindle 70 extends. The diameter of the aperture 66 is so dimensioned that, in the relative movement of the housing 61 and the spindle 70, both the collar 74 and the adjustment nut 67 together with its locking nut 68 can move into the inside the housing 61. The diameter of the aperture 66 is also so dimensioned that on the other hand the sliding bushings 63a, 63b cannot move outside the housing 61. Thus, in a relative movement of the housing 61 and the spindle 70, the housing caps 65 act as catches which enable the sliding bushings 63a, 63b to move together with the housing 61.

The section of the spindle 70 on the side of the stop away from the sliding section 71 has a further threaded portion 72 which engages in a spindlenut 69. The spindlenut 69 is fixed to the side arm 31 and is stationary with respect to the movably mounted fastening plate 50. The threaded section 72 enables the spindle 70 to be moved relative to the spindlenut 69 and thus the position of the compliance module 60 to be adjusted with respect to the side arm 31. The rotation of the threaded section 72 necessary for there to be relative movement between the spindle 70 and the spindlenut 69 is facilitated by an actuating section 73 of the spindle 70 which is designed in a hexagonal shape so that the spindle 70 can be turned by means of a spanner.

The handling device described above is characterized by the compliance module 60 which enables the fastening plate 50 to be moved against the return force of a spring element 62 between a starting position I and two end positions II, III defined in one case by the collar 74 and in the other case by the adjustment nut 67. In contrast to the prior art, the compliance module 60 thus ensures bi-directional compliance for the test head 40 attached to the fastening plate 50.

As shown in FIGS. 5a to 5c, in the starting position I, the sliding bushings 63a, 63b are pushed back by the spring element 62 against the stops formed by the collar 74 and the stops formed by the adjustment nuts 67. If, as shown in FIG. 5b, the fastening plate 50 and thus the housing 61 is moved from the starting position I into the end position II, then the housing 61 will be pushed over the forward-positioned—in the direction of movement—sliding bushing 63b, whereas the rear—in the direction of movement—sliding bushing 63a will be moved in the direction of the sliding bushing 63b because of the catch function performed by the housing cap 65. The spring element 62 braced between the sliding bushings 63a, 63b will thus be compressed until the flanges 64 of the sliding bushings 63a, 63b abut against each other. The stop that is formed by the contact of these two flanges 64 prevents the spring element 62 from being excessively compressed. When the force that has moved the fastening plate 50 into the end position II is removed, the sliding bushing 63a and the housing 61, as a result of the housing cap 65 once again functioning as a catch, return automatically into the starting position I as does the fastening plate 50 which is attached to the housing 61. This happens as a consequence of the return force generated by the spring element 62 compressed by the movement into the first end position II.

If, as is shown in FIG. 5c, the fastening plate 50 and thus the housing 61 is moved into the second end position III, then the housing 61 will be pushed over the sliding bushing 63a abutting against the collar 74 and simultaneously the rear—in the direction of movement—sliding bushing 63b will be moved towards the sliding bushing 63a. The spring element 62 braced between the sliding bushings 63a, 63b will once again be compressed as a result of the movement of sliding bushing 63b towards sliding bushing 63a and will thus generate the return force which will enable the housing 61 and thus the fastening plate 50 to return automatically into the starting position I.

Figure 6A:
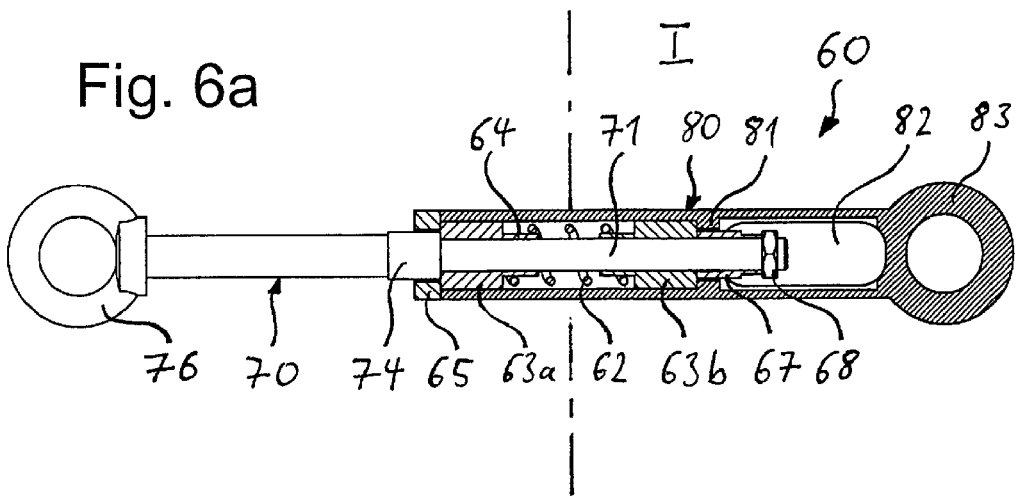
FIG. 6a is a cross-section as in FIG. 5a of a second embodiment of the compliance module, showing the compliance module in the starting position.
Figure 6B:
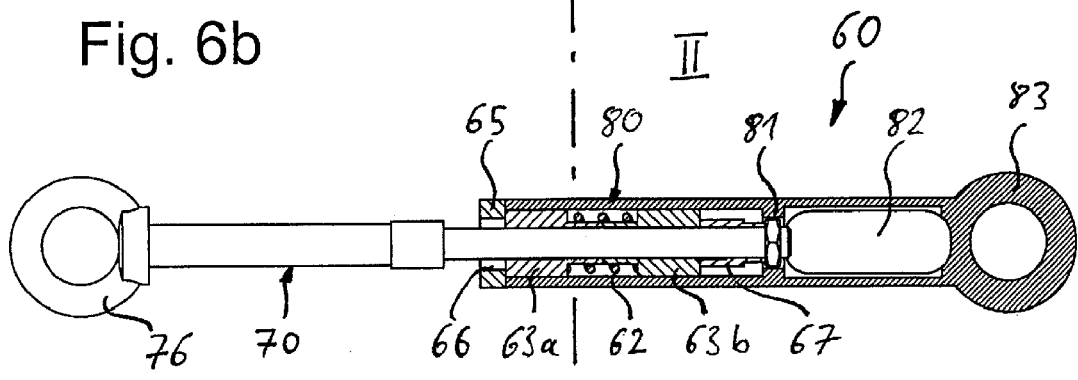
FIG. 6b is a cross-section as in FIG. 5b showing the compliance module in the first end position.
Figure 6C:
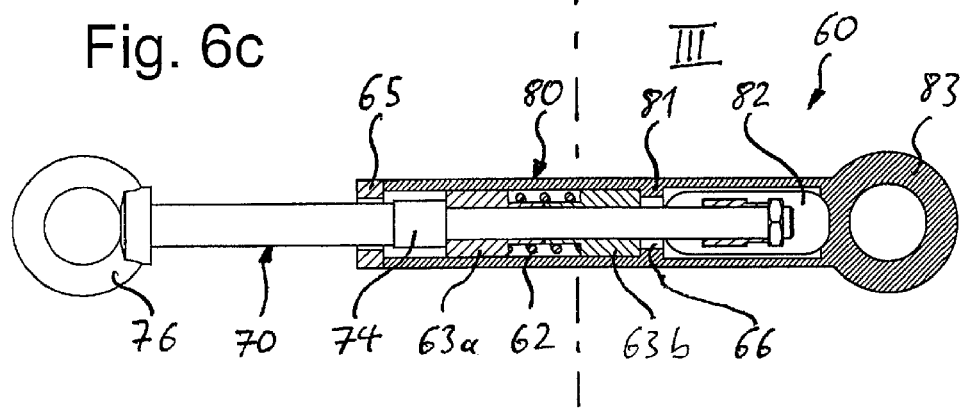
FIG. 6c is a cross-section as in FIG. 5c showing the compliance module in the second end position.

The compliance module shown in FIGS. 6a to 6c differs principally from the embodiment shown in particular in FIGS. 5a to 5c in that it has an articulated connection to the fastening plate 50 which is not shown. For this purpose the compliance module 60 has a housing 80 which is provided with an eyelet 83. In addition the spindle 70 is provided with an eyelet 76 at the end distant from the housing 80. As required, the eyelet 83 is connected to the fastening plate 50 with the help of a lever, whereas the eyelet 76 can be attached in an articulated manner to the side arm 31. As can also be seen in FIGS. 6a to 6c, the eyelet 83 is located on the end face of the housing 80. In contrast to the housing 61, shown in particular in FIGS. 5a to 5c, the housing 80 is closed with a housing cap 65 only on the side away from the eyelet 83. The function of the catch, which ensures, for example, that in the movement of the housing 80 from the starting position I into the second end position III, the rear—in the direction of movement—sliding bushing 63b is moved towards the sliding bushing 63a, is assumed by the flange 81 of the housing 80. The flange 81 located on the inner surface of the housing 80 is dimensioned in such a way that an aperture 66 remains whose clear width is greater than the diameter of the adjustment nut 67 and the locking nut 68 so that in the relative movement of the housing 80 and the spindle 70 these nuts may pass through the opening 66, as can be seen in particular in FIG. 6b. Between the flange 81 and the eyelet 83 there is a hollow space 82 which serves to accommodate part of the spindle 70 when the housing 80 moves from the starting position I into the second end position III, as is shown in particular in FIG. 6c.

The bi-directional compliance facilitated by the compliance module 60 enables the position of the test head 40 to be corrected by a slight to-and-fro movement. The return force generated by the compliance module 60 ensures that the fastening plates 50 on which the test head 40 is securely fixed always return to the starting position I. Accordingly, an exact and reliable positioning of the test head 40 is thus not hindered as a result of the compliance generated by the compliance module 60. This is also aided by the fact that the spring element 62 is pre-tensioned so that a movement of the fastening plates 50 is only possible if the force acting on the fastening plates 50 is greater than the strength of the pre-tensioning force.

The compliance generated by the embodiment of the compliance module 60 shown in particular in FIGS. 5a to 5c enables a linear to-and-fro movement of the test head 40. This is attributable to the movable linear arrangement of the fastening plate 50 on the side arm 31. If, by contrast, the fastening plate 50 were arranged on the side arm 31 in a rotatable manner and not rigidly, but connected in an articulated manner to the housing 80, as is possible in the second embodiment of the compliance module 60 shown in FIGS. 6a to 6c, then it would be possible to achieve a bi-directional compliance for e.g. the tumble movement α of the test head 40. Finally, the compliance module 60 thus has a universal configuration which enables bi-directional compliance movement in both a straight, linear direction and in a curved direction.

LIST OF REFERENCES 10 sub-frame
11 beam
12 crossbeam
13 foot plate
14 guide rail
20 positioning means
21 tower
22 vertical carriage
23 horizontal carriage
30 mounting
31 side arm
40 test head
50 fastening plate
51 carriage
52 guide rail
53 rotary guide
60 compliance module
61 housing
62 spring element
63a sliding bushing
63b sliding bushing
64 flange
65 housing cap
66 aperture
67 adjustment nut
68 locking nut
69 spindlenut
70 spindle
71 sliding section
72 threaded section
73 actuating section
74 collar
75 threaded section
76 eyelet
80 housing
81 flange
82 hollow space
83 eyelet
x first horizontal direction
y second horizontal direction
z vertical direction
φ twist movement
α tumble movement
I starting position
II first end position
III second end position

The invention claimed is:

1. A handling device for positioning a test head at a test station, the handling device comprising:
 positioning means movable in at least one axial direction for positioning a test head;
 a mounting connected to the positioning means;
 a movable fastening plate disposed on the mounting and biased toward a starting position;
 a compliance module for moving the fastening plate between the starting position and an end position against the bias wherein the compliance module comprises;
 a housing connected to the fastening plate,
 a spindle extending in an axial direction in the housing,
 a first sliding bushing and a second sliding bushing moveably retained on the spindle between a first stop and a second stop, the sliding bushings being movable relative to the housing, and
 a spring element between the first sliding bushing and the second sliding bushing, the spring element impinging the sliding bushings in the axial direction.

2. The handling device of claim 1, wherein the housing is closed by at least one housing cap, the housing cap being detachably connected to an end face of the housing.

3. The handling device of claim 2, wherein the housing cap has an aperture through a portion of the spindle extends.

4. The handling device of claim 1, wherein at least one of the sliding bushings has a flange against which the spring element abuts.

5. The handling device of claim 1, wherein at least one of the sliding bushings has a sliding surface which is supported on the housing.

6. The handling device of claim 1, wherein the spindle is provided with a sliding section on which the sliding bushings are movably arranged.

7. The handling device of claim 1, wherein the spindle has a collar which forms the first stop.

8. The handling device of claim 1, wherein the spindle includes a first threaded section on which an adjustment nut is located to form the second stop.

9. The handling device of claim 1, wherein the spring element is pre-tensioned.

10. The handling device of claim 1, wherein the spindle is provided with a second threaded section which engages with a spindlenut.

11. The handling device of claim 1, wherein the fastening plate linearly translates.

12. The handling device of claim 1, wherein the fastening plate is arranged to swivel about an axis of rotation.

13. The handling device of claim 1, wherein the fastening plate and the housing are rigidly connected.

14. The handling device of claim 1, wherein the fastening plate and the housing are integral.

15. The handling device of claim 1, wherein a connection of the fastening plate and the housing is articulated.

16. The handling device of claim 1, wherein at least one of the housing and the spindle includes an eyelet.

17. The handling device of claim 1, wherein the fastening plate is locked in a predetermined.

18. The handling device of claim 1, wherein the holder includes two side arms spaced to mount the test head therebetween.

19. The handling device of claim 18, wherein the fastening plate is arranged on at least one of the side arm, for attaching the test head to the fastening plate.

20. The handling device of claim 1, wherein the first and second sliding bushings contact the spindle.

21. A handling device for positioning a test head at a test station, the handling device comprising:
    a movably mounted fastening plate for holding a test head;
    a housing connected to the fastening plate;
    a spindle extending in an axial direction in the housing;
    a first sliding bushing and a second sliding bushing arranged on the spindle, and movable between a first stop and a second stop; and
    a spring element between the first sliding bushing and the second sliding bushing and contacting the sliding bushings in the axial direction;
    wherein the sliding bushings are movable relative to the housing.

22. The handling device of claim 21, wherein the first and second sliding bushings contact the spindle.

* * * * *